United States Patent

Lüchinger et al.

[11] Patent Number: 5,878,939
[45] Date of Patent: Mar. 9, 1999

[54] METHOD AND APPARATUS FOR DISPENSING LIQUID SOLDER

[75] Inventors: Christoph Lüchinger, Küssnacht a.R.; Guido Suter, Hünenberg, both of Switzerland

[73] Assignee: ESEC S.A., Cham, Switzerland

[21] Appl. No.: 672,748

[22] Filed: Jun. 28, 1996

[30] Foreign Application Priority Data

Jul. 1, 1995 [CH] Switzerland .......................... 01926/95

[51] Int. Cl.⁶ .................................................. B23K 3/06
[52] U.S. Cl. .......................... 228/33; 222/592; 222/594; 249/134
[58] Field of Search ......................... 228/33, 256; 164/98; 222/592, 593, 594; 249/134, 135, 141; 425/215, 565

[56] References Cited

U.S. PATENT DOCUMENTS

| | | | |
|---|---|---|---|
| 1,561,924 | 11/1925 | Henry | 249/134 |
| 2,875,719 | 3/1959 | Smith . | |
| 3,679,341 | 7/1972 | Graybill et al. | 425/565 |
| 3,804,566 | 4/1974 | Kimura et al. | 249/141 |
| 4,520,861 | 6/1985 | Sobolewski et al. | 222/594 |
| 4,527,717 | 7/1985 | Emoto et al. . | |
| 4,577,398 | 3/1986 | Sliwa et al. . | |
| 4,709,849 | 12/1987 | Socolowski . | |
| 4,783,041 | 11/1988 | Sakaida et al. | 249/134 |
| 4,915,609 | 4/1990 | Hahn et al. | 249/141 |
| 5,042,708 | 8/1991 | Ledermann et al. | 222/592 |
| 5,316,700 | 5/1994 | Soye et al. | 249/141 |

FOREIGN PATENT DOCUMENTS

| | | |
|---|---|---|
| 291716 | 7/1971 | Austria . |
| 36 12 341 | 10/1987 | Germany . |
| 37 34 550 | 11/1989 | Germany . |

*Primary Examiner*—Patrick Ryan
*Assistant Examiner*—Jeffrey T. Knapp
*Attorney, Agent, or Firm*—McCormick, Paulding & Huber

[57] ABSTRACT

In order to produce separate measured portions (1") of liquid solder, solid solder (1) in the form of wire or rod is guided through the longitudinal bore of a guide tube (20). A zone including the end (22) of the tube (20) is heated above the solder's melting temperature, in order to liquefy the solder. By contrast, an adjacent zone of the guide tube is cooled, whereby a positionally stable temperature transition is maintained in the tube (20). Thereby the amount of molten solder available above a narrowed outlet (62) is controlled. A drive mechanism (3) advances the solder (1) step by step so that the solid solder acts as a piston to eject portions of liquid solder through the aforesaid outlet (62). A suitable apparatus (5) for applying portions of solder to a substrate (4) can be raised and lowered (a). At its base it has a moulding die (6) connected to the outlet (62) that can be set down upon the substrate and has a moulding cavity open on its underside. This determines and restricts the surface wetted by the liquid solder (1') on the substrate (4). The main application is the bonding of semiconductor chips (8) by soft-soldering.

17 Claims, 3 Drawing Sheets

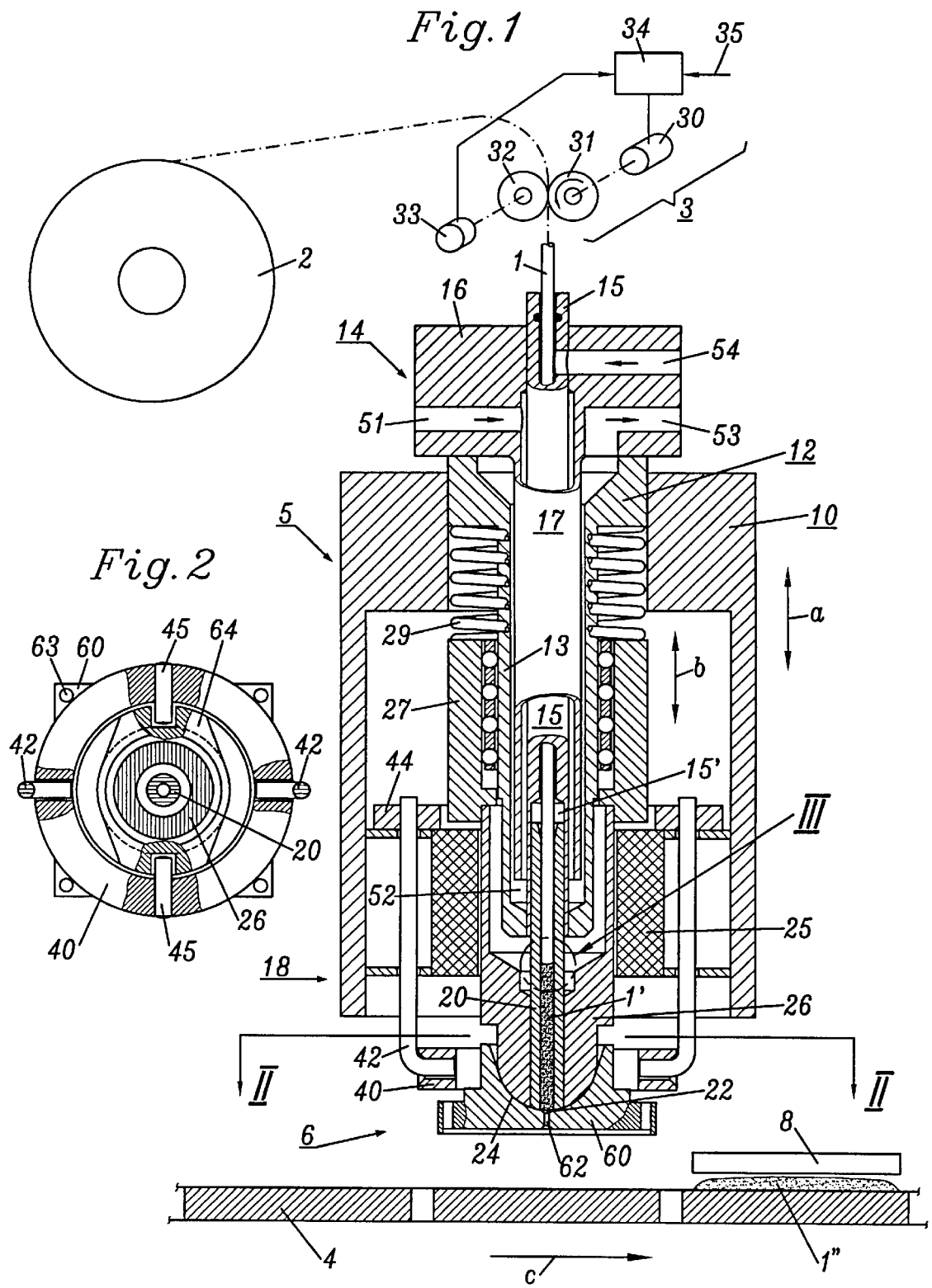

METHOD AND APPARATUS FOR DISPENSING LIQUID SOLDER

BACKGROUND OF THE INVENTION

The present invention relates to a method of dispensing liquid solder in separate portions; an apparatus for performing the method; and an interchangeable moulding die for use with the apparatus.

Soldering methods of this kind are typically (but not exclusively) used for bonding of semiconductor elements (chips) on a metal support (lead frame). In particular, power semiconductors are as a rule attached by soft solder to the substrate, usually of copper. The soldered joint ensures that heat produced in the semiconductor chip when in operation is dissipated more efficiently than it would if the joint were made of adhesive. However, particularly in case of increased power density, the soldered joint must be perfectly homogeneous, i.e. it should be of the specified thickness and evenly distributed, and the layer of solder should wet the whole area of the chip evenly, be entirely free from air cavities and from impurities. At the same time, as far as possible, the solder should not protrude from the edges nor spread beyond the area of the chip, and this in turn requires that an exact amount of solder is dispensed and is accurately positioned on the substrate. mass of liquid solder, the suitability of this apparatus for continuous operation seems doubtful.

More generally in the field of soft soldering, arrangements are known with conventional hand-held soldering irons and other similar soldering equipment, where a solder wire is progressively fed in a guidance system through a longitudinal bore to a perforated soldering tip preheated to the solder's melting temperature, and molten solder is forced out through a narrowed outlet in the soldering tip or is allowed to flow out by capillary action (e.g. DE-A-36 12 341, DE-C-37 34 550, AT 291 716, U.S. Pat. No. 2,875,719). In these the solder is melted in the soldering tip itself, whereby the amount of solder is indeterminate. In heating the soldering tip, the heat flow is generally from the rear towards the tip, hence there are usually heat-insulating guide sleeves fitted immediately behind the soldering tip or the heat source to inhibit heat flow toward the rear.

SUMMARY OF THE INVENTION

The primary object of the present invention is to propose solutions to overcome the aforesaid disadvantages of prior art. In particular, one of the objects of the present invention is to propose a method and apparatus for dispensing measured portions of liquid soft solder that are especially adapted for the technology of chip assembly, and are designed to make it possible to vary the amount of solder dispensed with great accuracy and reliability over a wide range of weight and volume. At the same time, in response to present-day mass-production needs, it should also provide short cycle times and a high degree of retooling flexibility.

These and other objects of the invention are met by a method apparatus for dispensing liquid solder in which a guide tube, through which solid solder is fed step-by-step, is heated at a forward zone and cooled at a rear zone to maintain along the tube a positionally stable temperature transition from below the solidus temperature to a temperature at which the solder is at least partially molten and liquid to control the level and mass of molten material available for ejection.

The invention further relates to a moulding die made from a material not wetted by liquid solder, of the invention and having a cavity open below and connecting with a sprue, particularly for use with the apparatus.

The invention's main advantages are that it readily provides a "single-stroke" process that permits high cycle rates. The dispensing capacity is mainly limited only by the heating power to melt the solder, which power can be automatically controlled regardless of the substrate. The constantly controlled heating temperature is of course adjusted in accordance with the particular requirements of the solder alloy. Because a temperature gradient as great as possible is maintained at the transition between the heated and the cooled zones of the guide tube, constant basic conditions are provided for the cyclic supply of solder portions, particularly a constant metallostatic pressure at the narrowed outlet. Thus the accuracy of the amount dispensed each time depends almost entirely upon how accurately the solder wire's rate of feed is being controlled. Moreover, subject only to the amount of molten solder available in the bore of the guide tube, the amount dispensed in each cycle is adjustable within wide limits. The use of a moulding die to apply portions of solder to a substrate also makes it possible to produce portions of a given area and thickness. Even on substrates not readily wetted by solder and/or heated to lower temperatures, the application of exactly dosed amounts of solder in well defined shapes is possible.

BRIEF DESCRIPTION OF DRAWINGS

The novel features of the invention as well as further objects and advantages thereof will be better understood from the following description in connection with the accompanying drawings, in which preferred embodiments of the invention—with special emphasis on the assembly of semiconductor chips on a metal substrate—are illustrated by way of example.

FIG. 1 is a partly diagrammatic vertical section of a first embodiment of an apparatus with a moulding die for soft-soldering semiconductor chips to a metal substrate;

FIG. 2 is a horizontal section along line II—II in FIG. 1;

DETAILED DESCRIPTION OF THE EMBODIMENTS OF INVENTION

Figure 3:
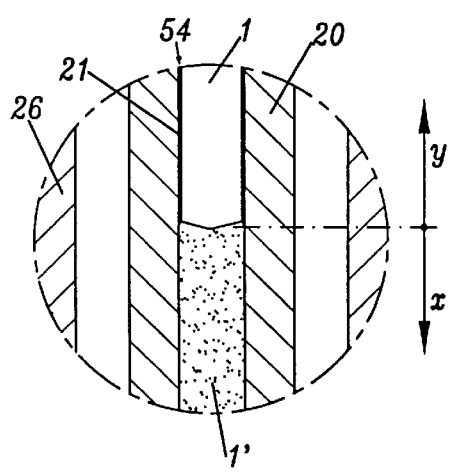
FIG. 3 shows at a larger scale the transition zone between solid and molten solder marked III in FIG. 1.

The typical embodiment shown as a whole in FIG. 1 is used to solder semiconductor chips 8 by soft solder to a strip of metal substrate (lead frame) 4 moved along step by step in the direction indicated by arrow c. A solder wire 1, for example 1 mm or 0.76 mm in diameter, is unreeled from a spool 2, inserted and advanced longitudinally down from above by a drive mechanism 3 through an apparatus 5, and melted in the lower part thereof. The whole of the apparatus 5 can be raised and lowered as indicated by arrow a. Liquid solder 1' is dispensed as separate portions—in the embodiment shown by means of a moulding die 6—by intermittent operation of the drive mechanism 3 whenever the apparatus 5 is lowered and the moulding die 6 lies on the substrate 4 (see FIG. 8). Thereby the heated metal substrate 4 is wetted by the solder ejected into the moulding die. The apparatus 5 is then raised and the substrate 4 with the portion of solder 1" deposited thereon is moved on, whereupon a chip 8 (shown only diagrammatically) is placed on the still liquid portion of solder 1".

The apparatus 5 is more or less vertically positioned. It consists in the main of a tubular housing 10, a guide unit 12, a connecting piece 14, a melting unit 18 with a moulding die 6, and a drive mechanism 3. The guide unit 12 and the connecting piece 14 are fixedly mounted in the housing 10. The melting unit 18 together with the moulding die 6 can carry out a certain vertical stroke lengthwise with respect to the guide unit 12, as indicated by arrow b.

The guide unit 12 has a tube 13 that projects downward. Inside the tube 13 there are two further concentric tubes 15 and 17, extending from the head 16 of the connecting piece 14. The lower ends of the tubes 15 and 13 a reconcentric. The solid solder 1 moves along the longitudinal bore of the inner tube 15. The lower part 15' of this longitudinal bore is widened to accommodate a sliding guide tube 20 that belongs to the melting unit 18. The longitudinal bore 21 (FIG. 3) of the guide tube 20 continues to the end outlet 22 and matches the diameter of the solid rod or wire of soft solder 1; the bore should not be more than 5% to 10% wider than the diameter of the solid solder.

Inside the housing 10 an annular electrical heater 25 is permanently fitted and surrounds the melting unit 18. This provides heat to a cylindrical crucible 26 without being in direct contact therewith. The upper end of crucible 26 is held by a sleeve 27 which is guided by ballbearings to slide up and down the tube 13. At their lower ends the crucible 26 and the guide tube 20 are permanently connected to each other.

The heater 25 heats the crucible 26, and this in turn heats a lower zone x (FIG. 3) of the vertical guide tube 20, including its lower end 22, in order to melt the solder, so that a lower zone of the tube 20 contains liquid molten solder 1'. The temperature in the heated lower zone of the tube 20 should generally be higher than the solder material's melting point, to ensure that the solder is completely melted. Some soldering alloys however can also be worked at temperatures below their liquidus temperature, so that the alloy melts only partly, i.e. it forms a mixture of solid and liquid components.

This latter case is therefore understood to be included whenever the terms molten, melted, and liquid are used in the present disclosure.—As explained in greater detail below, whenever the drive mechanism 3 operates to feed solid solder 1 down the guide tube 20, it causes the ejection of a portion of liquid solder 1' from the lower end of the bore 21. In the embodiment shown the solder is ejected into the moulding die 6 via its sprue gate (casting canal) 62 that forms a narrowed outlet at the end of the bore 21.

An upper zone y (FIG. 3) of the tube 20 adjacent to the heated zone x is cooled intensively to a temperature clearly below the solder material's solidus temperature. For this purpose the connecting piece 14 provides for the circulation of a suitable cooling medium, such as compressed air. The cooling medium is supplied through a canal 51, it then flows in the bore of the tube 17 along the outside of the tube 15 to an annular canal 52 at the bottom, and from there on the outside of the tube 17 up again to the exit canal 53. As a result, the upper zone y of the guide tube 20 is cooled through the thin-walled lower section of the tube 15, preferably by a constantly controlled cooling action.

Figure 4:
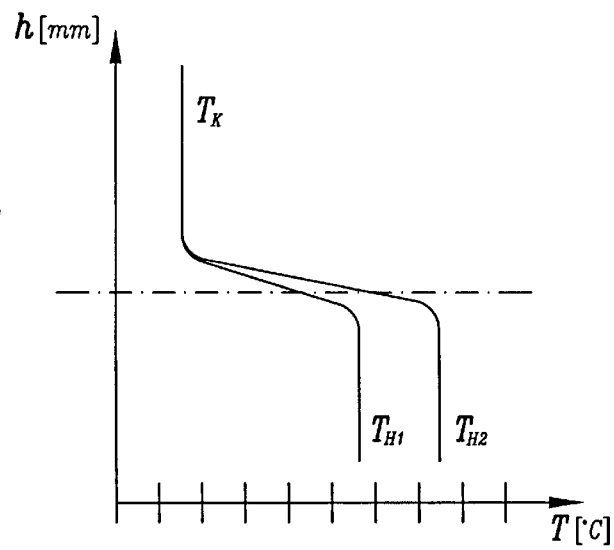
FIG. 4 is a temperature graph that refers to FIG. 3.

FIG. 3 is a larger-scale detail of the transition in the guide tube 20 from the lower heated zone x, where the guide tube 20 contains molten liquid solder 1', to the upper cooled zone y in which the solder 1 is still solid. FIG. 4 is a related graph that shows the temperature T as a function of the height h in the corresponding transition zone in tube 20. As shown, a steep transition of temperature is produced from zone y (temperature $T_K$) to zone x (temperatures $T_{H1}$ or $T_{H2}$). The heat supplied to the guide tube 20 by the crucible 26 is thermostatically controlled, for example by means of a temperature sensor (not shown) in the lower part of the crucible. The temperatures $T_{H1}$ and $T_{H2}$ in zone x are adjustable to suit the type of solder used at a given time, whereby, as may be seen from FIG. 4, the vertical position of the temperature transition varies only slightly. The melting point of typical soft-solder alloys varies from about 150° C. to 410° C. To ensure thorough melting of the solder for dispensing and application, some overheating of the crucible and tube to a working temperature $T_H$ is usually necessary, for example to about 450° C. As a rule, therefore, the preset temperature $T_H$ should be higher than the solder's liquidus temperature, although as aforesaid some solders need not be thoroughly melted use ($T_H$ within the melting interval of the solder alloy).

In practice the position of the temperature transition produced by the joint effects of (controlled) heating and cooling proves to be very stable. The level of the molten solder in the bore 21 and thus the amount of liquid solder available at any given time before ejection can thus be controlled. The narrowed outlet 62 would make it possible to hold back the molten solder even if the capillary effect in the bore 21 and the cohesion of the molten material were insufficient. Further details of the narrowed outlet 62 are given below with reference to FIGS. 9 and 10.

As the solid solder 1 is fed into the bore 21, it acts upon the liquid solder 1' rather like a piston or plunger. As the solid portion moves forward, it melts immediately to the stable vertical position of the temperature transition. The heating power depends mainly upon the quantity of solder to be dispensed in operation per unit of time. At the end of the solid part of the solder wire a certain sealing effect occurs automatically in that, as molten material penetrates into the gap between the wire and the wall of the bore, it congeals at once and is pushed along with the wire. As a result of this sealing effect in the range of the large temperature gradient between zones x and y, considerable pumping pressure can be exerted upon the liquid solder 1'.

An atmosphere of protective gas or forming gas should preferably be maintained in the bore 21 of the guide tube 20 and extend as far as the molten solder 1'. FIG. 1 therefore shows a gas connection 54 for this purpose in the head 16 of the connecting piece 14. The protective gas or forming gas spreads along the solder wire 1 to the wider bore 15' of tube 15 and thence to the annular gap in the bore 21 to the molten material 1' (FIG. 3). For example, nitrogen or argon are suitable for use as protective gas. As a forming gas a reactive deoxidizing gas should be used, for example a hydrogen-nitrogen mixture, the purpose of which is to keep the melt and the bore 21 free from contaminating oxides.

The drive mechanism 3 shown in FIG. 1 for advancing the rod or wire-type solder 1 step by step has a driving roller 31 and a sensor roller 32 which guide the solder between them. A motor 30 (preferably a step motor) that receives a feed signal from a control unit 34 is connected to the driving roller 31. The feed signal to the motor 30 is derived in the control unit, on the one hand, from an input signal 35 that represents the nominal amount of solder to be ejected at a given time and, on the other, from a path-measuring signal generated by a rotary encoder 33 connected to the sensor roller 32 which indicates the effective distance that the solder is moved forward. The solid solder 1 used may be assumed to have a constant cross-section, hence a given amount of forward travel of the solid solder 1 corresponds exactly to a given volume of the portion of liquid solder ejected through the outlet 22.

As aforesaid, the apparatus shown transfers portions of solder to the substrate 4 by means of a moulding die 6 immediately adjacent to the guide tube 20. The tube 20 and the crucible 26, on the one hand, and the body 60 of the moulding die 6, on the other, are in contact with each other along a spherical surface 24 that also contains the outlet 22. As FIG. 2 shows in detail, a gimbal mount keeps the moulding die 6 in contact with the spherical surface 24. Two rods 42 arranged on one diameter of the gimbal ring 40 keep the ring free to swing; they extend up into the housing 10 and are secured to a carrier ring 44 that sits loosely in the housing 10. Two bearing pins 45 project inward from the gimbal ring 40 on a diameter offset by 90° to the diameter formed by the rods 42. A collar 64 with semicircular cutouts 65 lies on the bearing pins 45 and rests on the body 60 of the moulding die 6 (also refer to FIGS. 6 and 7). This gimbal mount thus allows the moulding die 6 to swing freely in all directions relative to the spherical surface 24, so as to fit the upper face of the substrate 4 closely as the moulding die 6 is lowered. A pretensioned compression spring 29 above the sleeve 27 exerts a constant contact pressure on the spherical surface 24, whereby the moulding die 6 maintains its position when it is raised, and produces a good sealing action against the outflow of solder at the point of transition from the tube 20 to the hole 62 in the moulding die 6.

This arrangement also makes it easy to exchange different moulding dies with one another. For this purpose the moulding die fitted is raised; this compresses the compression spring 29 above the crucible 26 and sleeve 27. When the raised moulding die is then turned through 90°, the collar 64 moves with it past the bearing pins 45 so as to bring the grooves 65 into approximate alignment with the rods 42 and to allow the moulding die to be removed downward. A new moulding die can then be fitted in analogous (reverse) order. This design ensures a high positional accuracy and makes re-adjustment unnecessary after a change of moulding dies. Thus the only parts of the apparatus that come into contact with the liquid solder and may therefore be subject to a certain contamination are the moulding die 6, the crucible 26, and the tube 20. But the design shown has the advantage that it permits the fast, easy, and repeatable replacement of the crucible 26 and the tube 20.

The crucible 26 also transfers heat by way of the spherical surface 24, in order to maintain the temperature of the moulding die 6 at the working temperature TH of the solder. The moulding die 6, the crucible 26, and the guide tube 20 are made of material that cannot be wetted by the molten solder 1'. Graphite, ceramic, glass, stainless steel, and titanium are among the suitable materials.

Figure 5:
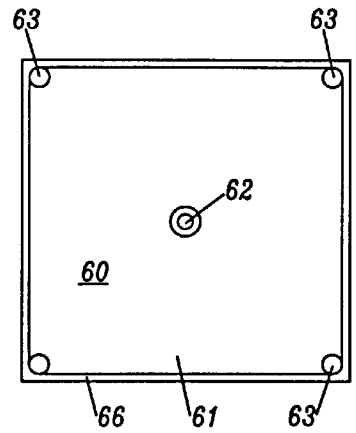
FIG. 5 is a plan view from below of a moulding die used in an apparatus according to FIG. 1.
Figure 6:
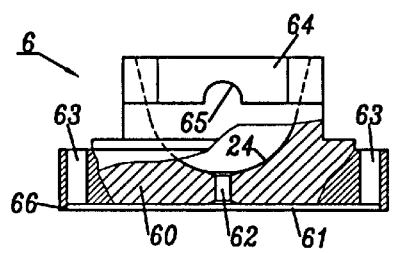
FIG. 6 is a partial section and side elevation of the aforesaid moulding die.
Figure 7:
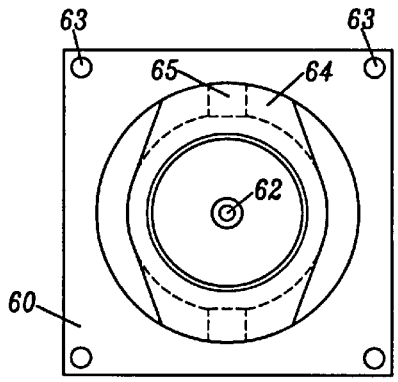
FIG. 7 is a plan view of the moulding die from above.

FIGS. 5, 6, and 7 show further preferred design features of the moulding die, especially as regards the die's moulding cavity. The moulding cavity 61 in the die 6 on the underside of body 60 is open below toward the substrate and is bounded by a bearing edge 66. The moulding cavity 61 communicates with the outlet 22 of the guide tube 20 by a relatively narrow sprue 62.

The moulding cavity 61 has risers or vent holes 63 open at the top in the body 60 of the moulding die 6. As shown, these vent holes should preferably be at the corners and/or near the edges of the moulding cavity 61, to ensure that the mould fills quickly and completely, but the positions of the vent holes must obviously be chosen to suit the geometry of the moulding cavity, and the surface area of the moulding cavity must in turn suit the size of the chip that is to be soldered into place on the substrate. As is well known, when the chip is then applied, the deposited layer of molten liquid solder is "sqeezed" in the soldering gap by the chip until both the chip and the substrate are completely wetted over the total area of the chip.

When the apparatus shown is ready for operation, a certain supply of liquid solder 1' is available in the lower zone x of the guide tube 20. Capillary action in the bore 21 and particularly in the narrowed canal 62 prevents the liquid solder 1' from running out by itself. The apparatus is then lowered, as indicated by arrow a, until the moulding die 6 abuts on the substrate 4. It is lowered with a small amount of overtravel, hence the spring 29 is slightly compressed and the ring 44 rised. The spring 29 also reduces the impact of the moulding die upon the substrate 4. When the moulding die 6 strikes the substrate 4, its gimbal mount and the effect of the spring allow it to adapt exactly to any slight inclination in the position of the substrate 4, and the bearing edge 66 tightly closes the moulding cavity 61. This overtravel can also overcome certain tolerances in the vertical position of the substrate 4 and the finished height of the moulding die 6.

Figure 8:
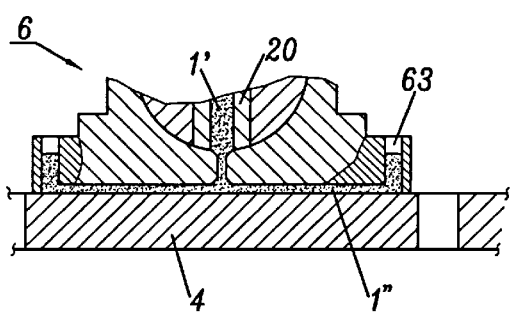
FIG. 8 is a section of the moulding die set on the substrate and showing a portion of solder ejected into the moulding cavity.

At the latest when the moulding die 6 lands on the substrate, a start signal 35 (nominal feed length) triggers the forward motion of the solid solder 1, and this causes a corresponding, measured portion of liquid solder to be ejected through the outlet 22 into the moulding cavity 61; any air present escapes through the vent holes 63. FIG. 8 shows that the liquid solder will also rise in the vent holes 63 when the cavity 61 is full.

Further advantages are obtained if ejection of the solder begins shortly before the moulding die 6 comes into contact with the substrate 4, i.e. if the start signal 35 begins a little sooner. This makes it possible to reduce overall cycle time, because there is some time overlap in lowering the tool and ejecting the solder. At the same time, after a drop of solder is ejected, it can start to spread freely sideways over a considerable part of the target surface and to wet the substrate before the moulding die touches it, unimpeded by the usually very slight height of the moulding cavity 61 (the depth of the recess 61 in the body 60 usually is much less than shown for greater clarity in FIGS. 1, 6, and 8). The lateral spread of the liquid solder continues as the moulding die lands fully on the substrate.

One effect of the risers or vent holes 63, namely of ensuring that the mould fills completely, has already been referred to. It is of advantage to make use of the storage volume provided by the vent holes 63 (quite considerable as compared with the volume of the moulding cavity 61), by making the moulding cavity 61 slightly shallower than would be necessary to obtain the specified finished thickness of the solder layer below the bonded chip. As FIG. 8 shows, when the moulding die sits firmly on the substrate, a considerable part of the required amount of solder is forced up the risers or vent holes 63, whereby the whole of the mould's surface is wetted right out to its corners and edges, even when there is some variation in the amount of solder ejected. As the moulding die 6 is raised, the solder in the vent holes 63 immediately flows back and spreads across the wetted surface. The vent holes 63 also make it possible to vary by their own volume the amount of solid solder fed in and thus the volume of solder dispensed; this makes it possible to use the same moulding die 6 for making soldered joints of various finished thicknesses.

As soon as a cycle of advancing the solid solder and ejecting the required amount of liquid solder is completed, the apparatus 5 is raised from the substrate. This causes the molten solder to adhere to the substrate and to break off in the narrowed canal 62 below the outlet 22. As aforesaid, the liquid solder left in the vent holes 63 spreads across the area wetted by the solder. The heated substrate 4 is then advanced a step in a known manner, as indicated by arrow c; the next field of substrate arrives under the apparatus and a chip 8 is placed on the shifted, still liquid solder portion 1″ just applied. The next work cycle can thus begin.

It is also possible in a single cycle to dispense two or more separate portions of solder next to one another on the same surface of substrate, each portion having a predefined extent and precise position. For this purpose, a particular moulding die (not shown) is used with distinct moulding cavities for each required portion of solder. Each of these moulding cavities is supplied from the outlet 22 by a sprue of its own. It is possible to break down the total portion of solder ejected in a single cyle into separate portions to suit different volumes of separate moulding cavities by adapting the flow resistance of these sprues, e.g. their diameter and length.

Finally, it is also possible to use the method according to the invention—however with an embodiment of apparatus different from that shown and described above—to apply measured portions of solder to a substrate without the use of a moulding die. In a first version of this, a drop of liquid solder is formed at the outlet when the solid rod of solder is advanced by a given amount, then the outlet and the substrate are approached to each other until the drop touches the substrate and adheres thereto. Though this method does not produce a given surface pattern defined by a moulding cavity, it allows precisely positioned and exactly measured portions of solder to be dispensed in rapid sequence.

In a further version of using the method without a moulding die, the solid solder is advanced toward the narrowed outlet in rapidly pulsed motions to eject measured portions of liquid solder in jets upon the substrate. Under certain conditions of ejection—short pulses and a sufficient gap between the outlet and the substrate—this forms the portion of solder into a free drop or sphere once it leaves the outlet. In a special application or further variation of this version of the method, ejections of the solder may be synchronized with a lateral movement of the outlet at a given height above the substrate. This makes it possible to describe a pattern of solder on the substrate that corresponds to the movement of the outlet. Both these versions retain the advantages of dispensing exactly measured amounts of solder and exact positioning of the solder on the substrate.

Figure 9:
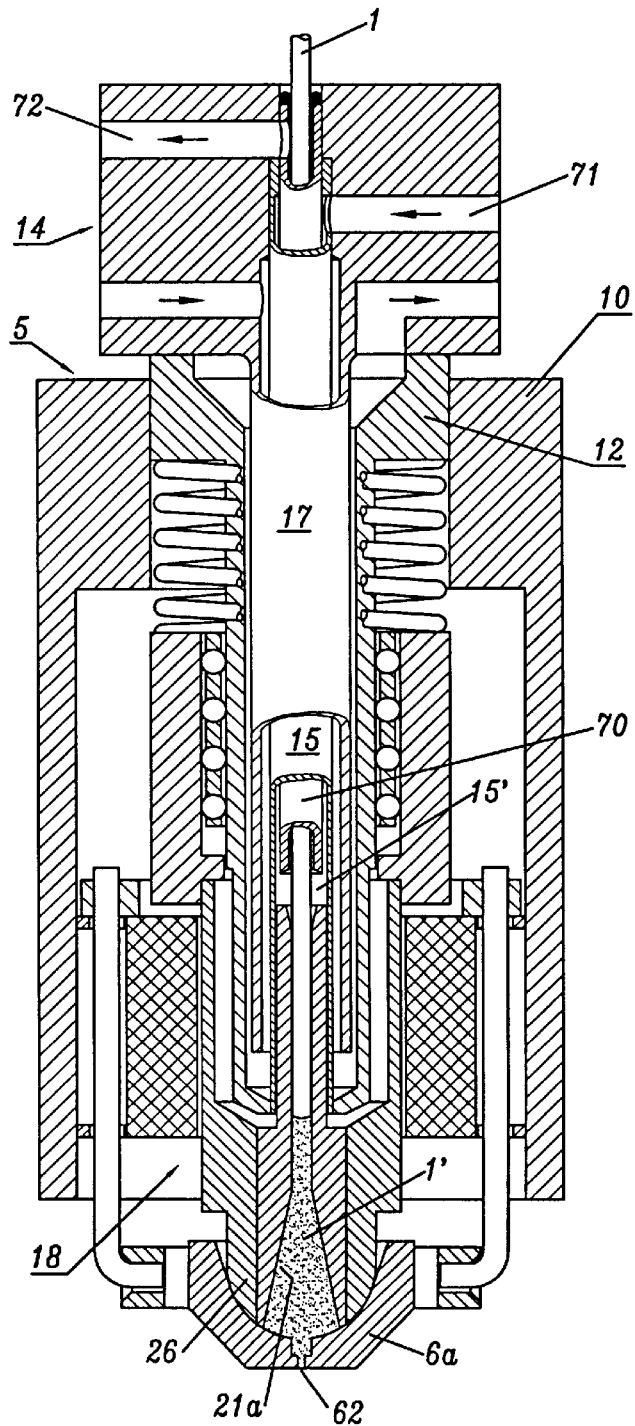
FIG. 9 shows a further embodiment of an apparatus for soft-soldering, whose vertical section is similar to FIG. 1.

The embodiment of the apparatus shown in FIG. 9 is generally similar in design to that of FIG. 1, hence its main components have the same reference numbers as there. The method already described in connection therewith also generally applies to this, but there are certain useful modifications, as described below:

Firstly, FIG. 9 provides for a forced and controlled flow of protective or forming gas across the space 15′ through which the solid solder 1 passes. For this purpose there is an additional tube 70 inside the tube 15 of the guidance system, at a distance from the inner surface of tube 15. The forming or protective gas is supplied through a hole 71 in the connecting piece 14 into the annular canal between tubes 70 and 15, and thence to the annular space 15′. From there the gas flows up along the solder wire 1 in the guide bore of tube 70 and is drawn off by suction through hole 72. The partial vacuum thus produced in the annular space 15′ keeps any unwanted gas, notably oxygen, clear of the molten solder and of the solder wire as it is guided to the heated zone; it thus continually forces out any unwanted gas that might seep in through the entrance of the wire 1 or which is present in the sliding gap between the guide tube 20 and the lower section of tube 15. It is important that no excessive gas pressure is produced in the space 15′ that could act along the wire 1 upon the molten solder 1′ and interfere with the holding and ejection processes of the molten material.

In the apparatus shown in FIG. 1 and described in connection therewith, the volume of liquid solder 1′ made available in the tube 20 is given by the controlled vertical distance of the temperature transition between the solid and liquid solder above the outlet 62, and the diameter of the solder wire 1 that corresponds to the diameter of the (cylindrical) bore 21. As aforesaid, this vertical distance can be set at different levels, but because the metallostatic pressure increases with height, it cannot be set at will. In theory, the volume of liquid solder could be increased by the use of larger-diameter wire, but in practice there are also limits to this, because the wire is supplied on spools. As FIG. 9 shows, it is however possible, if necessary, to increase the available volume of molten solder considerably if the bore 21 in the lower section of the heated zone is widened as shown at 21a in FIG. 9. This does not increase the metallostatic pressure on the outlet 62 nor reduce the sealing effect by the piston formed of solid solder.

Finally, the typical embodiment shown in FIG. 9 has a body 6a instead of a moulding die 6, but this is still interchangeable and fits closely against the lower end of the guide tube and the spherical surface of the crucible 26. The perforated body 6a again forms a narrowed outlet 62 through which the liquid solder is ejected. Such an embodiment is preferable for the versions of the method described above in which no moulding die is used, i.e. where drops of solder are ejected on to a substrate or where the solder is ejected as the apparatus moves laterally. As this figure shows, such a body 6a is held in position by the same kind of system as a moulding die and is thus as easily interchangeable.

Figure 10:
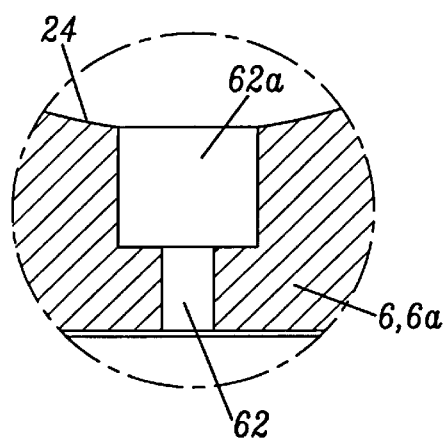
FIG. 10 is a larger-scale detail of a special embodiment of the narrowed outlet in FIG. 9.

As said above in connection with the first embodiment, each portion of solder breaks off inside the hole 62. Since the point of rupture in the length of the hole is indeterminate, this results in a certain variation in the volume of successive portions of solder. To obtain more accurately measured amounts of solder, it is proposed to reduce the length of the hole 62, as particularly FIG. 10 shows, by widening the upper part of the hole 62a. This ensures that the molten solder can break off only in the short part of the hole 62. The means shown in FIG. 10 and described in connection therewith is of course equally suitable for a body 6a in accordance with FIG. 9 as for a moulding die 6.

What is claimed is:

1. A moulding die for use with an apparatus for dispensing solder, comprising:
   a component defining a moulding cavity open below and being connected to a sprue having an upper part extending downwardly to a lower part adjacent to the moulding cavity;

wherein the component has a spherical surface for engaging the apparatus for dispensing solder, and a gimbal mount for connecting with the apparatus.

2. A moulding die for use with an apparatus for dispensing solder, comprising:

a component defining a moulding cavity open below and being connected to a sprue having an upper part and extending downwardly to a lower part adjacent to the moulding cavity; and wherein the upper part of the sprue is wider than, and non-linearly formed with, the part of the sprue adjacent to the moulding cavity.

3. A moulding die for use with an apparatus for dispensing solder, comprising:

a component defining a moulding cavity open below and being connected to a sprue; and wherein the component further comprises vent holes connected with the moulding cavity and wherein the vent holes allow the storage of solder to supplement the volume of solder in the moulding cavity.

4. An apparatus for dispensing solder comprising: a guidance system for guiding solid solder in the form of wire or rod, said guidance system including a heated, at least approximately vertical guide tube and a narrowed outlet for liquid solder, and having a drive mechanism acting upon the solid solder for advancing it step by step towards said outlet, wherein heater means for melting the solder material are arranged for heat supply to a heating zone of the guide tube including said outlet, and cooling means for the guide tube are provided to cool a cooling zone of the guide tube adjacent to said heating zone to a temperature below the solidus temperature of the solder material.

5. An apparatus in accordance with claim 4, wherein said zone (y) of the guide tube (20) to be cooled is surrounded by an annular space (52) through which a cooling gas circulates.

6. An apparatus in accordance with claim 4, wherein the bore (21) of the guide tube (20) has a widened part (21a) in the lower portion of the heated zone (x) for taking up liquid solder (1').

7. An apparatus in accordance with claim 4, further including means for maintaining an atmosphere of protective gas or forming gas in a bore of the guide tube above the molten solder.

8. An apparatus in accordance with claim 4, further including means for forcing a flow of protective gas or forming gas across an annular space communicating with a bore of the guide tube through which the solid solder passes.

9. An apparatus in accordance with claim 4, further including:

a moulding die positioned adjacent to the guide tube, the moulding die having a moulding cavity communicating with the outlet of the guide tube and opening towards a substrate to be treated with solder; and means for ejecting solder into the moulding die immediately before contact of the die with the substrate.

10. An apparatus in accordance with claim 4, wherein the drive mechanism includes means for advancing solid solder in a pulse like manner in order to eject in jets portions of liquid solder towards a substrate.

11. Apparatus in accordance with claim 4, wherein the area of the outlet adjacent to the tube is wider than the area of the opposite side of the outlet.

12. An apparatus in accordance with claim 4, further including:

a moulding die positioned adjacent to the guide tube, the moulding die having a moulding cavity communicating with the outlet of the guide tube and opening towards a substrate to be treated with solder; and means for ejecting solder into the moulding die in contact with the substrate.

13. An apparatus in accordance with claim 12, wherein the moulding die defines vent holes extending from the moulding cavity, the volume of the solder issuing from the means for ejecting and the volume of the moulding cavity and vent holes being so matched with one another that upon ejection of portions of the solder some of the solder rises up the vent holes in order to flow back upon an area of substrate wetted by solder when the molding die is raised.

14. An apparatus in accordance with claim 4, wherein a heated, drilled-through component (6, 6a) is interchangeably held in contact with the end (22) of the guide tube (20), a hole in said component forming said narrowed outlet (62).

15. An apparatus in accordance with claim 14, wherein said drilled-through, interchangeable component or said moulding die (6, 6a) respectively is in contact with the end (22) of said tube (20) along a spherical surface (24) and is suspended on a gimbal mount in relation thereto.

16. An apparatus in accordance with claim 14, for the application of portions of solder (1") upon a substrate (4), wherein said drilled-through, interchangeable component is a moulding die (6) made of a material non-wettable by molten solder (1') and having a moulding cavity (61) open towards the substrate (4), the gate or sprue (62) of said moulding die communicating with said hole (21) of the guide tube (20), and wherein said guide tube (20) and moulding die (6) can be raised and lowered together relative to the substrate (4).

17. An apparatus in accordance with claim 16, wherein the moulding die (6) has vertical vent holes (63) for receiving molten solder (1'), rising from the moulding die's cavity (61) preferably in its corners or along the edges thereof.

* * * * *